(12) United States Patent
Bandiera et al.

(10) Patent No.: US 9,728,711 B2
(45) Date of Patent: Aug. 8, 2017

(54) THERMALLY-ASSISTED MRAM CELLS WITH IMPROVED RELIABILITY AT WRITING

(71) Applicant: Crocus Technology SA, Grenoble (FR)

(72) Inventors: Sebastien Bandiera, Corenc (FR); Ioan Lucian Prejbeanu, Seyssinet Pariset (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 14/787,957

(22) PCT Filed: Apr. 11, 2014

(86) PCT No.: PCT/EP2014/057415
§ 371 (c)(1),
(2) Date: Oct. 29, 2015

(87) PCT Pub. No.: WO2014/177368
PCT Pub. Date: Nov. 6, 2014

(65) Prior Publication Data
US 2016/0079516 A1 Mar. 17, 2016

(30) Foreign Application Priority Data
Apr. 29, 2013 (EP) .................................. 13290096

(51) Int. Cl.
*H01L 43/02* (2006.01)
*G11C 11/16* (2006.01)
(Continued)

(52) U.S. Cl.
CPC ............ *H01L 43/02* (2013.01); *G11C 11/161* (2013.01); *G11C 11/1675* (2013.01);
(Continued)

(58) Field of Classification Search
CPC ...................................................... H01L 43/08
See application file for complete search history.

(56) References Cited

U.S. PATENT DOCUMENTS

2005/0110004 A1   5/2005  Parkin
2011/0084347 A1*  4/2011  Shin ....................... B82Y 25/00
                                                       257/421

FOREIGN PATENT DOCUMENTS

EP      2276034 A2      1/2011
FR      2924851 A1      6/2009
WO      2009026249 A1   2/2009

OTHER PUBLICATIONS

International Search Report for PCT/EP2014/057415 dated Jul. 11, 2014.
Written Opinion for PCT/EP2014/057415 dated Jul. 11, 2014.

* cited by examiner

*Primary Examiner* — Alexander Ghyka
(74) *Attorney, Agent, or Firm* — Pearne & Gordon LLP

(57) ABSTRACT

MRAM cell including a magnetic tunnel junction including a reference layer, a storage layer having a storage magnetization, a tunnel barrier layer between the reference and the storage layers; and an antiferromagnetic layer exchange-coupling the storage layer such as to pin the storage magnetization at a low temperature threshold and free it at a high temperature threshold. The storage layer includes a first ferromagnetic layer in contact with the tunnel barrier layer, a second ferromagnetic layer in contact with the antiferromagnetic layer, and a low saturation magnetization storage layer including a ferromagnetic material and a non-magnetic material. The MRAM cell can be written with improved reliability.

9 Claims, 3 Drawing Sheets

(51) Int. Cl.
*H01L 43/08* (2006.01)
*H01L 27/22* (2006.01)
*H01L 43/10* (2006.01)

(52) U.S. Cl.
CPC ............ *H01L 27/222* (2013.01); *H01L 43/08* (2013.01); *H01L 43/10* (2013.01)

THERMALLY-ASSISTED MRAM CELLS WITH IMPROVED RELIABILITY AT WRITING

FIELD

The present invention concerns a thermally assisted (TA) magnetic random access memory (MRAM) cell that can be written with improved reliability.

DESCRIPTION OF RELATED ART

A TA-MRAM cell comprises a magnetic tunnel junction including a magnetic storage layer having a storage magnetization that can be switched during a writing operation, a non-magnetic barrier layer and a reference layer having a fixed reference magnetization.

The magnetic tunnel junction further comprises an antiferromagnetic storage layer exchange-coupling the storage layer such as to pin the storage magnetization at a low temperature threshold, or read temperature, and free it at a high temperature threshold, or write temperature. During a writing operation, the magnetic tunnel junction is heated at the write temperature freeing the storage magnetization such that the storage magnetization can be switched in a written direction, for example, under application of a magnetic field. After writing, the magnetic tunnel junction is cooled down to the read temperature such that the storage magnetization is pinned in the written direction.

In usual storage layers made of a ferromagnetic material comprising a Co, Fe or Ni based alloy, micromagnetic states can appear in the storage layer during the writing operation. When such micromagnetic states appear, the storage magnetization may be oriented partly in directions that are different than the switching orientation of the storage magnetization. The resulting resistance of the magnetic tunnel junction having a "partially" switched storage magnetization will thus has a value that is intermediate between the resistance value that would be obtained for the fully switched storage magnetization and the unswitched storage magnetization. In other words, the resistance of the magnetic tunnel junction after the writing operation will have an intermediate value between a high resistance state, wherein the storage magnetization is fully switched antiparallel to the reference magnetization, and a low resistance state, wherein the storage magnetization is parallel to the reference magnetization. Micromagnetic states being formed in the storage layer can thus lead to writing errors.

FR2924851 discloses a MRAM element with thermally-assisted writing using a field or spin transfer provided, including a magnetic reference layer, an insulating layer, a magnetic storage layer and an antiferromagnetic layer. The element further comprises at least one bilayer, consisting respectively of a ferromagnetic layer and a non-magnetic layer.

EP24479484 discloses a self-referenced MRAM cell containing a magnetic tunnel junction formed from an insulating layer comprised between a sense layer and a storage layer.

WO2009026249 discloses a magnetic device including a magnetic including a fixed layer having a fixed layer magnetization, a spacer layer that is nonmagnetic, and a free layer having a free layer magnetization. The free layer is changeable due to spin transfer when a write current above a threshold is passed through the first free layer. The free layer includes a low saturation magnetization material.

US2005110004 discloses a magnetic tunnel element including a first layer formed from an amorphous material, an amorphous tunnel barrier layer, and an interface layer between the first layer and the tunnel barrier layer.

EP2276034 discloses a magnetic random access memory cell containing a magnetic tunnel junction formed from an insulating layer comprised between a sense layer and a storage layer. The present disclosure also concerns a method for writing and reading the memory cell comprising, during a write operation, switching a magnetization direction of said storage layer to write data to said storage layer and, during a read operation, aligning magnetization direction of said sense layer in a first aligned direction and comparing said write data with said first aligned direction by measuring a first resistance value of said magnetic tunnel junction. The disclosed memory cell and method allow for performing the write and read operations with low power consumption and an increased speed.

SUMMARY

The present disclosure concerns a TA-MRAM cell comprising a magnetic tunnel junction including a reference layer, a storage layer having a storage magnetization, a tunnel barrier layer comprised between the reference and the storage layers; and an antiferromagnetic layer exchange-coupling the storage layer such as to pin the storage magnetization at a low temperature threshold and free it at a high temperature threshold; the storage layer comprising a first ferromagnetic layer in contact with the tunnel barrier layer, a second ferromagnetic layer in contact with the antiferromagnetic layer, and a low saturation magnetization (low-$M_S$) storage layer between the first ferromagnetic layer and the second ferromagnetic layer, wherein the low saturation magnetization storage layer has a saturation magnetization which is lower than the saturation magnetization of the first ferromagnetic layer and lower than the saturation magnetization of the second ferromagnetic layer, characterized in that the low saturation magnetization storage layer comprising a Co, Fe or Ni based alloy, wherein the Co, Fe or Ni based alloy comprises between 1 at. % and 40 at. % of a non-magnetic element selected from Ta, Ti, Cr, V, Nb, Hf, Mo, Zn and Zr or of an alloy of at least one of these non-magnetic elements.

In an embodiment, said low-magnetization storage layer comprises an alternately multilayer arrangement comprising at least one ferromagnetic layer and one non-magnetic layer, preferably between one and five of each of said ferromagnetic layer and said non-magnetic layer.

The non-magnetic layer can comprise an element selected from Ta, Ti, Cr, V, Nb, Hf, Mo, Zn or Zr, or an alloy of at least one of these elements. The non-magnetic layer can have a thickness between 0.05 nm and 1 nm.

The ferromagnetic layer can comprise a Co, Fe or Ni based alloy and preferentially a CoFe, NiFe or CoFeB based alloy. The ferromagnetic layer can have a thickness between 0.05 nm and 2 nm.

In another embodiment, said low-magnetization storage layer comprises a Co, Fe or Ni based alloy comprising between 1 at. % and 40 at. % of an element selected from Ta, Ti, Cr, V, Nb, Hf, Mo, Zn or Zr or an alloy of at least one of these elements.

The low-magnetization storage layer can be prepared by using sputter deposition with a target comprising between 1 at. % and 40 at. % of an element selected from Ta, Ti, Cr, V, Nb, Hf, Mo, Zn or Zr or an alloy of at least one of these elements. Sputter deposition can comprise using a target containing at least one of the elements Co, Fe or Ni for preparing the ferromagnetic layer and another target containing at least one of the elements Ta, Ti, Cr, V, Nb, Hf, Mo, Zn or Zr for preparing the non-magnetic layer.

The TA-MRAM cell having the low-$M_S$ storage layer has reduced formation of micromagnetic states in the storage layer during a writing operation. A write error during writing the TA-MRAM cell is thus less likely to appear than with a conventional TA-MRAM cell.

BRIEF DESCRIPTION OF THE DRAWINGS

The disclosure will be better understood with the aid of the description of an embodiment given by way of example and illustrated by the figures, in which.

DETAILED DESCRIPTION OF POSSIBLE EMBODIMENTS

Figure 1:
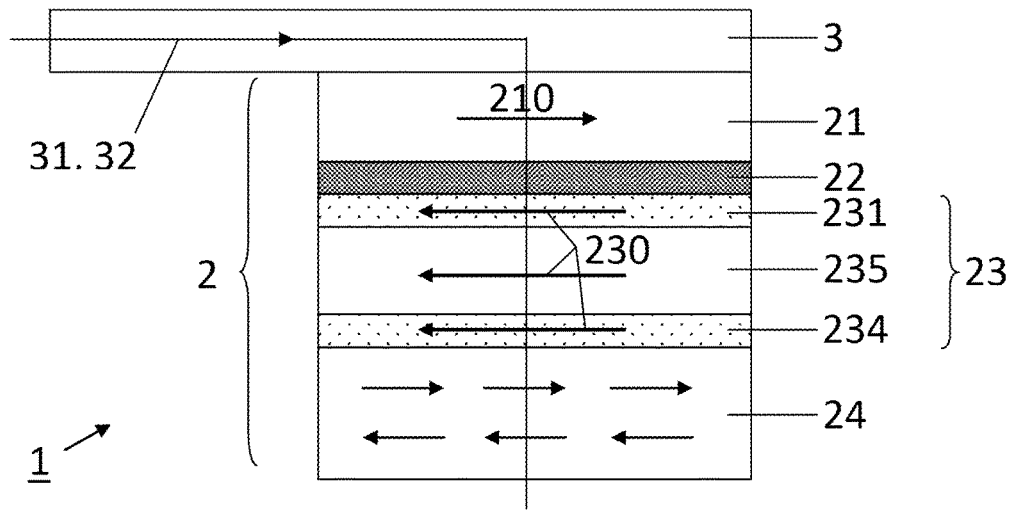
FIG. 1 illustrates a MRAM cell comprising a low-$M_S$ storage layer, according to an embodiment.

A MRAM cell 1 according to an embodiment is represented in FIG. 1. The MRAM cell 1 comprises a magnetic tunnel junction 2 including a reference layer 21, a storage layer 23 having a storage magnetization 230, a tunnel barrier layer 22 comprised between the reference and the storage layers 21, 23. The magnetic tunnel junction 2 further comprises an antiferromagnetic layer 24 exchange-coupling the storage layer 23 such as to pin the storage magnetization 230 at a read temperature threshold and free it at a write temperature threshold. The storage layer 23 comprises a low saturation magnetization (low-$M_S$) storage layer 235 comprising a ferromagnetic material and a non-magnetic material. The storage layer 23 further comprises a first ferromagnetic layer 231 in contact with the tunnel barrier layer 22 and a second ferromagnetic layer 234 in contact with the antiferromagnetic layer 24.

In an embodiment, the low-$M_S$ storage layer 235 comprises a Co, Fe or Ni based alloy comprising between 1 at. % and 40 at. % of a non-magnetic element selected from Ta, Ti, Cr, V, Nb, Hf, Mo, Zn or Zr or an alloy of at least one of these elements.

The low-$M_S$ storage layer 235 can be obtained by doping a Co, Fe or Ni based alloy with at least one of the elements selected from Ta, Ti, Cr, V, Nb, Hf, Mo, Zn or Zr.

In an embodiment, the first ferromagnetic layer 231 is such as to enhance the tunnel magnetoresistance of the magnetic tunnel junction 2 in comparison to the magnetic tunnel junction 2 having only the low-$M_S$ storage layer 235. In particular, the first ferromagnetic layer 231 comprising a CoFe, Fe or CoFeB-based alloy and having a thickness that is comprised between 0.5 nm and 2 nm allows enhancing the tunnel magnetoresistance of the magnetic tunnel junction 2 to a value being above 80%.

In another embodiment, the second ferromagnetic layer 234 is arranged such as to enhance the exchange field between the antiferromagnetic layer 24 and the storage layer 23 in comparison to the magnetic tunnel junction 2 without this layer. In particular, the second ferromagnetic layer 234 comprising a Co, Ni or Fe based alloy, preferentially CoFe or NiFe alloy, and having a thickness comprised between 0.2 nm and 2 nm Can enhance the exchange field to a value being above 150 Oe.

Figure 2:
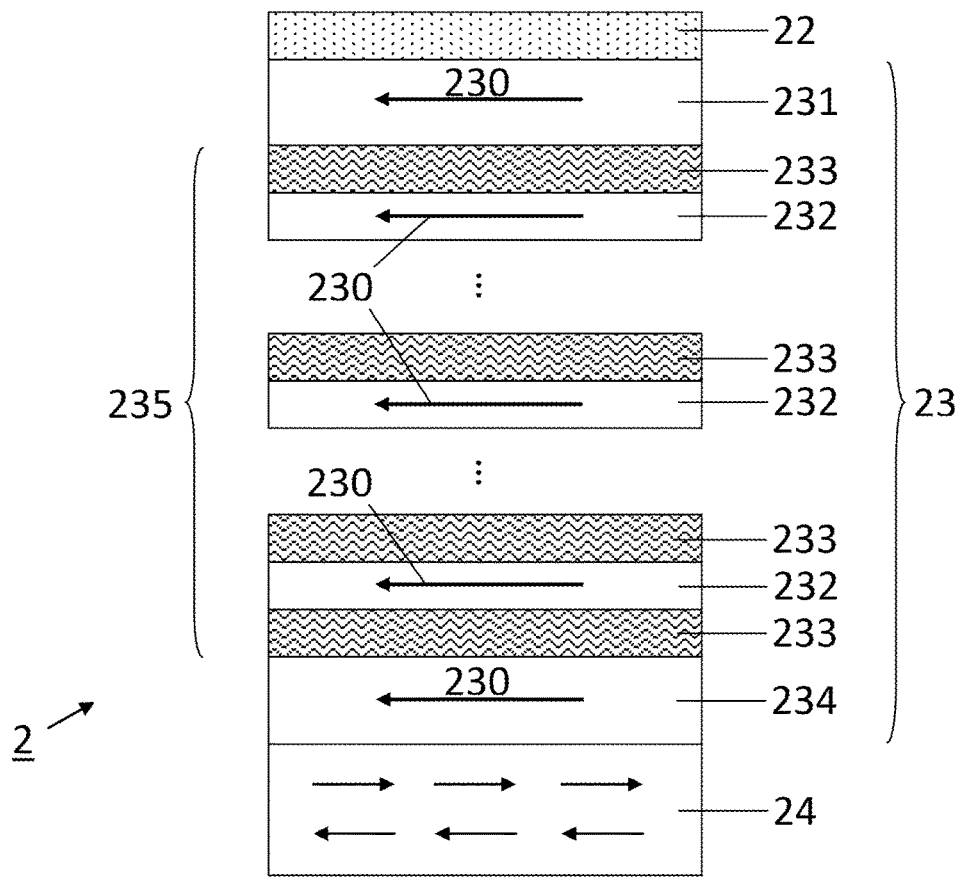
FIG. 2 represents a alternately multilayer arrangement of the low-magnetization storage layer, according to an embodiment.

In yet another embodiment represented in FIG. 2, the low-$M_S$ storage layer 235 comprises an alternately multilayer arrangement comprising at least one ferromagnetic layer 232 and one non-magnetic layer 233. The low-$M_S$ storage layer 235 comprises typically between one and five of each of said ferromagnetic layer 232 and said non-magnetic layer 233.

In yet another embodiment, the non-magnetic layer 233 comprises an element selected from Ta, Ti, Cr, V, Nb, Hf, Mo, Zn or Zr, or an alloy of at least one of these elements. The non-magnetic layer 233 can have a thickness comprised between 0.05 nm and 1 nm.

In yet another embodiment, the ferromagnetic layer 232 comprises a Co, Fe or Ni based alloy and preferentially a CoFe, NiFe or CoFeB based alloy. The ferromagnetic layer 232 has a thickness comprised between 0.05 nm and 2 nm.

Figure 3:
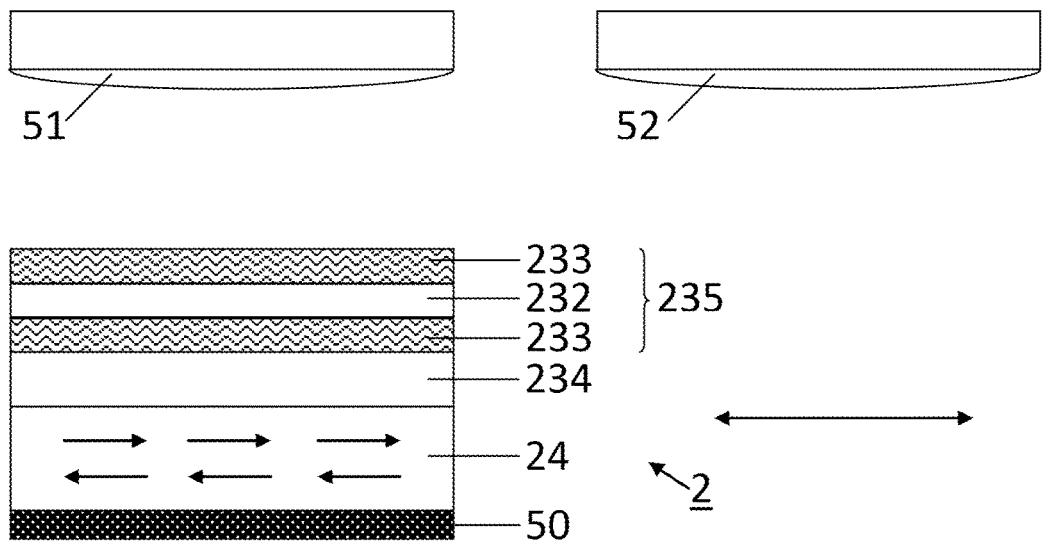
FIG. 3 represents a sputter deposition process for preparing the alternately multilayered low-$M_S$ storage layer of FIG. 2, according to an embodiment.

In an embodiment represented in FIG. 3, the alternately multilayered low-$M_S$ storage layer 235 is prepared by using sputter deposition technique. The sputter deposition technique can comprise depositing the ferromagnetic layer 232 by using a first target 51 containing at least one of the elements Co, Fe or Ni. The sputter deposition technique can further comprise depositing the non-magnetic layer 233 by using a second target containing at least one of the elements Ta, Ti, Cr, V, Nb, Hf, Mo, Zn or Zr. During the deposition process, a substrate 50 comprising the magnetic tunnel junction 2 with the multilayered low-$M_S$ storage layer 235 is sequentially transported proximate to the first target 51 and to the second target 52 to alternatively deposit the ferromagnetic layer 232 and the non-magnetic layer 233.

Figure 4:
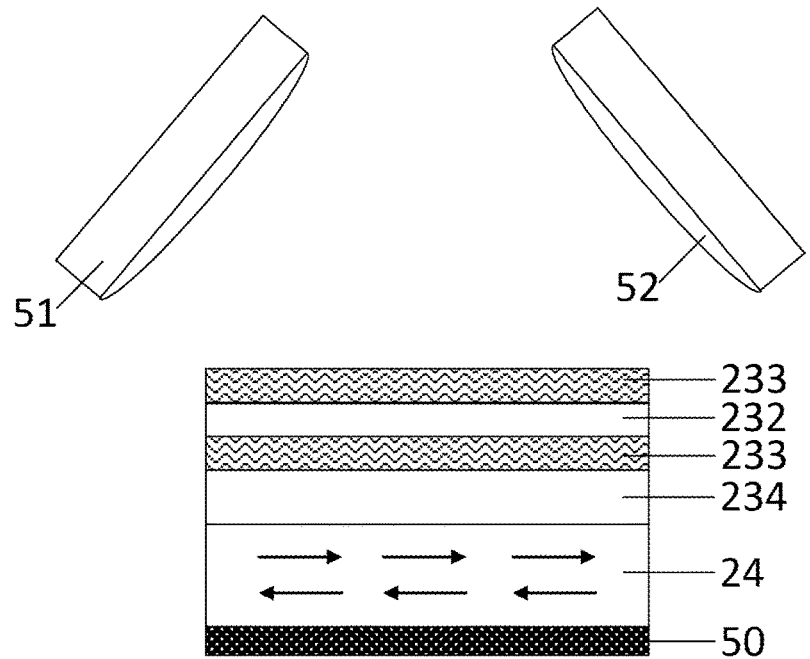
FIG. 4 shows represents a sputter deposition process for preparing the low-$M_S$ storage layer of FIG. 1, according to an embodiment.

FIG. 4 shows the deposition of the low-$M_S$ storage layer 235 according to the embodiment of FIG. 1. The low-$M_S$ storage layer 235 is prepared by using a co-sputter deposition technique with a first target 51 comprising a Co, Fe or Ni based alloy and a second target comprising a non-magnetic element selected from Ta, Ti, Cr, V, Nb, Hf, Mo, Zn or Zr or an alloy of at least one of these elements. The concentration of the elements in the first and second targets 51, 52 are selected such as to obtain the low-$M_S$ storage layer 235 comprising a Co, Fe or Ni based alloy comprising between 1 at. % and 40 at. % of a non-magnetic element selected from Ta, Ti, Cr, V, Nb, Hf, Mo, Zn or Zr or an alloy of at least one of these elements. Alternatively, the low-$M_S$ storage layer 235 can be deposited by using only one target (not shown) having the appropriate concentration of the low-$M_S$ storage layer 235 to be prepared.

Figure 5:
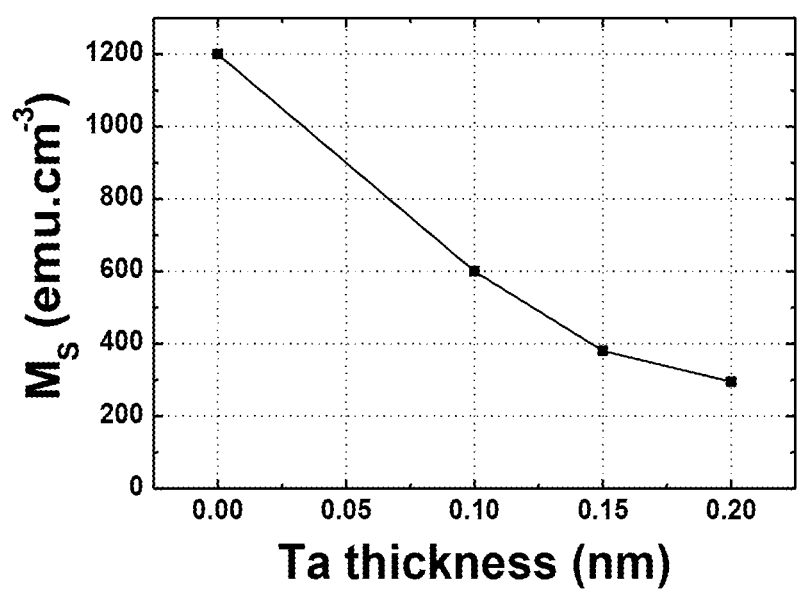
FIG. 5 shows a graph displaying the saturation magnetization Ms against the thickness of the Ta non-magnetic layer in the multilayered low-$M_S$ storage layer, according to an embodiment.

FIG. 5 shows a graph where the measured saturation magnetization Ms is plotted against the thickness of the Ta non-magnetic layer 233. In the example of FIG. 5, the saturation magnetization Ms was measured for a stack having the following layer sequence: $Ta_3/CuN_3/IrMn_{12}/CoFe_1/Ta_{0.2}/(CoFeB_{0.5}/Ta)_{x4}/CoFeB_1/MgO$. The graph of FIG. 5 shows that the saturation magnetization Ms is reduced from about 1200 emu·cm$^{-3}$ in the absence of the non-magnetic layer 233 to about 300 emu·cm$^{-3}$ for the non-magnetic layer 233 having a thickness of 0.2 nm.

In an embodiment not represented, a method for writing to the MRAM cell 1 can comprise the steps of:

heating the magnetic tunnel junction 2 to the write temperature threshold such as to free the storage magnetization 230;

switching the storage magnetization 230; and cooling the magnetic tunnel junction 2 to the read temperature such as to pin the storage magnetization 230.

The MRAM cell 1 can further comprise a current line 3 in electrical communication with one end of the magnetic tunnel junction 2 (see FIG. 1), such that heating the magnetic tunnel junction 2 can be performed by passing a heating current 32 in the magnetic tunnel junction 2 via the current line 3. Switching the storage magnetization 230 can be performed by applying a magnetic field 42 by passing a write current 41 in the current line 3.

Alternatively, the write current 41 can be passed in another field line (not represented). Switching the storage magnetization 230 can also be performed by passing a spin-polarized current 31 in the magnetic tunnel junction 2, for example, via the current line 3.

The storage magnetization 230 correspond to the magnetization contribution of the first ferromagnetic layer 231, second ferromagnetic layer 234 and of the low-$M_S$ storage layer 235. In the case of the multilayered low-$M_S$ storage layer 235, the storage magnetization further corresponds to the magnetization contribution of each of the ferromagnetic layers 232. The antiferromagnetic layer 24 thus exchange-couples the magnetization of the first and second ferromagnetic layers 231, 234 and of the low-$M_S$ storage layer 235, such as to pin the storage magnetization 230 at a read temperature threshold and free it at a write temperature threshold.

In another variant, the reference layer 21 can have a reference magnetization 210 that is reversible such that the MRAM cell 1 can be used as a self-referenced MRAM cell 1.

Micromagnetic states are less likely to be formed in the low-$M_S$ storage layer 235 during the writing operation than when a conventional storage layer is written. Moreover, the micromagnetic states possibly formed in the low-$M_S$ storage layer 235 are less stable than the ones formed in a conventional storage layer. Consequently, the switched storage magnetization 230 of the low-$M_S$ storage layer 235 will comprise less micromagnetic states having a magnetization orientation that differ from the orientation of the switched storage magnetization 230. The storage magnetization will thus be substantially fully switched and the resistance of the magnetic tunnel junction after the writing operation will be more reliably at the high or low resistance states. Writing to the TA-MRAM cell 1 is thus less likely to produce a write error than writing to a conventional TA-MRAM cell.

In an embodiment not represented a MRAM device comprises a plurality of the MRAM cell 1 described herein and a plurality of the current line 3 being operatively coupled with the plurality of MRAM cells 1. The plurality of MRAM cells 1 can be arranged in an array of rows and columns.

REFERENCE NUMBERS AND SYMBOLS 1 magnetic random access memory (MRAM) cell
2 magnetic tunnel junction
21 reference layer
210 reference magnetization
22 tunnel barrier layer
23 storage layer
230 storage magnetization
231 first ferromagnetic layer
232 ferromagnetic layer
233 non-magnetic layer
234 second ferromagnetic layer
235 low saturation magnetization storage layer
24 antiferromagnetic layer
3 current line
31 spin-polarized current
32 heating current
50 substrate
51 first target
52 second target

The invention claimed is:

1. MRAM cell comprising a magnetic tunnel junction including a reference layer, a storage layer having a storage magnetization, a tunnel barrier layer comprised between the reference and the storage layers; and an antiferromagnetic layer exchange-coupling the storage layer such as to pin the storage magnetization at a low temperature threshold and free it at a high temperature threshold; wherein the storage layer comprises a first ferromagnetic layer in contact with the tunnel barrier layer, a second ferromagnetic layer in contact with the antiferromagnetic layer, and a low saturation magnetization storage layer between the first ferromagnetic layer and the second ferromagnetic layer, wherein the low saturation magnetization storage layer has a saturation magnetization which is lower than the saturation magnetization of the first ferromagnetic layer and lower than the saturation magnetization of the second ferromagnetic layer, the low saturation magnetization storage layer comprising a Co, Fe or Ni based alloy, wherein the Co, Fe or Ni based alloy comprises between 1 at. % and 40 at. % of a non-magnetic element selected from Ta, Ti, Cr, V, Nb, Hf, Mo, Zn and Zr or of an alloy of at least one of these non-magnetic elements; and the orientation of magnetizations in the first ferromagnetic layer, the second ferromagnetic layer, and the low saturation magnetization storage layer are the same.

2. The MRAM cell according to claim 1, wherein the first ferromagnetic layer comprises CoFe, Fe or CoFeB-based alloy and has a thickness comprised between 0.5 nm and 2 nm.

3. The MRAM cell according to claim 1, wherein the second ferromagnetic layer is such that the exchange field has a value being above 150 Oe.

4. The MRAM cell according to claim 1, wherein the second ferromagnetic layer comprises a CoFe or NiFe based alloy and has a thickness comprised between 0.2 nm and 2 nm.

5. The MRAM cell according to claim 1, wherein said low saturation magnetization storage layer is prepared by using sputter deposition with a target comprising between 1 at. % and 40 at. % of an element selected from Ta, Ti, Cr, V, Nb, Hf, Mo, Zn or Zr or an alloy of at least one of these elements.

6. MRAM device comprises a plurality of MRAM cells, each MRAM cell comprising a magnetic tunnel junction including a reference layer, a storage layer having a storage magnetization, a tunnel barrier layer, and an antiferromagnetic layer exchange-coupling the storage layer such as to pin the storage magnetization at a low temperature threshold and free it at a high temperature threshold; wherein the storage layer comprises a first ferromagnetic layer in contact with the tunnel barrier layer, a second ferromagnetic layer in contact with the antiferromagnetic layer, and a low saturation magnetization storage layer between the first ferromagnetic layer and the second ferromagnetic layer, wherein the low saturation magnetization storage layer has a saturation magnetization which is lower than the saturation magnetization of the first ferromagnetic layer and lower than the saturation magnetization of the second ferromagnetic layer; the low saturation magnetization storage layer comprising a Co, Fe or Ni based alloy, wherein the Co, Fe or Ni based alloy comprises between 1 at. % and 40 at. % of a non-magnetic element selected from Ta, Ti, Cr, V, Nb, Hf, Mo, Zn and Zr or of an alloy of at least one of these non-magnetic elements; and the orientation of magnetizations in the first ferromagnetic layer, the second ferromagnetic layer, and the low saturation magnetization storage layer are the same;

the MRAM device further comprising a plurality of current lines being operatively coupled with the plurality of MRAM cells.

7. An MRAM cell comprising a magnetic tunnel junction including a reference layer, a storage layer having a storage magnetization, a tunnel barrier layer comprised between the reference and the storage layers; and an antiferromagnetic layer exchange-coupling the storage layer such as to pin the storage magnetization at a low temperature threshold and free it at a high temperature threshold; wherein the storage layer comprises a first ferromagnetic layer in contact with the tunnel barrier layer, a second ferromagnetic layer in contact with the antiferromagnetic layer, and a low saturation magnetization storage layer between the first ferromagnetic layer and the second ferromagnetic layer, wherein the low saturation magnetization storage layer has a saturation magnetization which is lower than the saturation magnetization of the first ferromagnetic layer and lower than the saturation magnetization of the second ferromagnetic layer, wherein the low saturation magnetization storage layer is in direct contact with the first and second ferromagnetic layers;

the low saturation magnetization storage layer comprising a Co, Fe or Ni based alloy, wherein the Co, Fe or Ni based alloy comprises between 1 at. % and 40 at. % of a non-magnetic element selected from Ta, Ti, Cr, V, Nb, Hf, Mo, Zn and Zr or of an alloy of at least one of these non-magnetic elements.

8. The MRAM cell according to claim 1, wherein the storage magnetization contributions of the first ferromagnetic layer, the second ferromagnetic layer, and of the low saturation magnetization storage layer are the same.

9. The MRAM device according to claim 6, wherein the storage magnetization contributions of the first ferromagnetic layer, the second ferromagnetic layer, and the low saturation magnetization storage layer are the same.

* * * * *